United States Patent
Chen et al.

(10) Patent No.: US 11,099,671 B2
(45) Date of Patent: Aug. 24, 2021

(54) TOUCH DISPLAY ASSEMBLY AND METHOD FOR MANUFACTURING SAME

(71) Applicant: WUHAN CHINA STAR OPTOELECTRONICS SEMICONDUCTOR DISPLAY TECHNOLOGY CO., LTD., Wuhan (CN)

(72) Inventors: Caiqin Chen, Wuhan (CN); Dan Liu, Wuhan (CN)

(*) Notice: Subject to any disclaimer, the term of this patent is extended or adjusted under 35 U.S.C. 154(b) by 277 days.

(21) Appl. No.: 16/347,813

(22) PCT Filed: Mar. 11, 2019

(86) PCT No.: PCT/CN2019/077598
§ 371 (c)(1),
(2) Date: May 7, 2019

(87) PCT Pub. No.: WO2020/124802
PCT Pub. Date: Jun. 25, 2020

(65) Prior Publication Data
US 2021/0181877 A1    Jun. 17, 2021

(30) Foreign Application Priority Data
Dec. 18, 2018  (CN) .......................... 201811549952.3

(51) Int. Cl.
*G06F 3/041* (2006.01)

(52) U.S. Cl.
CPC .. *G06F 3/0412* (2013.01); *G06F 2203/04103* (2013.01)

(58) Field of Classification Search
CPC ...... G06F 3/0412; G06F 3/044; G06F 3/0443; G06F 2203/04111; G06F 2203/04103; G06F 3/0416; G06F 3/041; G06F 3/0446; G06F 3/03547; G06F 2203/0338; H01L 27/323; G02F 1/13338
See application file for complete search history.

(56) References Cited

U.S. PATENT DOCUMENTS

| | | | |
|---|---|---|---|
| 2016/0198575 A1* | 7/2016 | Kim ...................... | G06F 3/0443 216/13 |
| 2018/0151662 A1 | 5/2018 | Rhe et al. | |
| 2018/0203555 A1* | 7/2018 | Miyamoto ............ | H01L 27/323 |

(Continued)

FOREIGN PATENT DOCUMENTS

| CN | 103928493 A | 7/2014 |
|---|---|---|
| CN | 108110031 A | 6/2018 |

(Continued)

*Primary Examiner* — Sanjiv D. Patel

(57) ABSTRACT

A touch display assembly and a method for manufacturing the same are provided. The touch display assembly includes a display device, a first organic insulating layer, a second organic insulating layer, a first touch sensing electrode, a second touch sensing electrode, and a protective layer. The first touch sensing electrode and the second touch sensing electrode are both disposed on the second organic insulating layer. A bridge portion of the first touch sensing electrode passes through the second organic insulating layer and is overlapped by the second touch sensing electrode. In the touch display assembly, film layers are prevented from separating from each other after being bent multiple times.

10 Claims, 5 Drawing Sheets

(56) References Cited

U.S. PATENT DOCUMENTS

| | | | |
|---|---|---|---|
| 2019/0221779 A1* | 7/2019 | Jang | .................... G06F 3/0412 |
| 2019/0363137 A1 | 11/2019 | Feng | |
| 2020/0249782 A1* | 8/2020 | Nakayama | .............. C03C 3/083 |

FOREIGN PATENT DOCUMENTS

| | | |
|---|---|---|
| CN | 108183121 A | 6/2018 |
| CN | 108807470 A | 11/2018 |
| KR | 20180077142 A | 7/2018 |

\* cited by examiner

TOUCH DISPLAY ASSEMBLY AND METHOD FOR MANUFACTURING SAME

FIELD OF INVENTION

The present invention relates to a technical field in displays, and particularly to a touch display assembly and a method for manufacturing same.

BACKGROUND OF DISCLOSURE

A conventional flexible touch display panel includes several layers of devices or films, and the devices and films are stacked together.

After undergoing several times of bending, stress on some of the devices or the films in the conventional flexible touch display panel becomes great, thereby causing some of the devices or films to be separated from other devices or films, and affecting touch performance of the conventional flexible touch display panel.

Therefore, it is necessary to provide a new technical solution to solve the above technical problem.

SUMMARY OF INVENTION

An object of the present disclosure is to provide a touch display assembly and a method for manufacturing same, which avoids separation of some of devices or films in the touch display assembly from other devices or films after undergoing many times of bending.

In order to solve the above problem, the technical solution of the present disclosure is as follows:

A touch display assembly, comprising:
a display device;
a touch device disposed on the display device, and including:
a first organic insulating layer disposed on the display device;
a second organic insulating layer disposed on the first organic insulating layer;
a first touch sensing electrode;
a second touch sensing electrode; and
a protective layer;
wherein the first touch sensing electrode and the second touch sensing electrode are both disposed on the second organic insulating layer; and in a direction perpendicular to a plane which the display device faces, a bridge portion of the first touch sensing electrode passes through the second organic insulating layer and is overlapped by the second touch sensing electrode;
wherein the first organic insulating layer is formed by cleaning a surface of the display device, disposing a first organic insulating material on the surface of the display device, curing the first organic insulating material, and ashing the cured first organic insulating material; and
wherein the second organic insulating layer is formed by cleaning a surface of the bridge portion of the first touch sensing electrode and a surface of a portion of the first organic insulating layer which is not covered by the bridge portion, disposing a second organic insulating material on the surface of the bridge portion of the first touch sensing electrode and the surface of the portion of the first organic insulating layer which is not covered by the bridge portion, curing the second organic insulating material, and ashing the cured second organic insulating material.

In the touch display assembly, material of any one of the first organic insulating layer, the second organic insulating layer, and the protective layer is photoresist material, resin material, or polyimide material.

In the touch display assembly, at least a portion of the bridge portion is disposed on the first organic insulating layer.

In the touch display assembly, at a place where the bridge portion of the first touch sensing electrode is overlapped by the second touch sensing electrode, the second organic insulating layer is disposed between the bridge portion and the second touch sensing electrode.

A touch display assembly, comprising:
a display device;
a touch device disposed on the display device, and including:
a first organic insulating layer disposed on the display device;
a second organic insulating layer disposed on the first organic insulating layer;
a first touch sensing electrode;
a second touch sensing electrode; and
a protective layer;
wherein the first touch sensing electrode and the second touch sensing electrode are both disposed on the second organic insulating layer; and in a direction perpendicular to a plane which the display device faces, a bridge portion of the first touch sensing electrode passes through the second organic insulating layer and is overlapped by the second touch sensing electrode.

In the touch display assembly, material of any one of the first organic insulating layer, the second organic insulating layer, and the protective layer is photoresist material, resin material, or polyimide material.

In the touch display assembly, at least a portion of the bridge portion is disposed on the first organic insulating layer.

In the touch display assembly, at a place where the bridge portion of the first touch sensing electrode is overlapped by the second touch sensing electrode, the second organic insulating layer is disposed between the bridge portion and the second touch sensing electrode.

In the touch display assembly, the protective layer is disposed on the first touch sensing electrode and the second touch sensing electrode, and disposed on a portion of the second organic insulating layer which is not covered by the first touch sensing electrode and the second touch sensing electrode.

In the touch display assembly, the first organic insulating layer is formed by cleaning a surface of the display device, disposing a first organic insulating material on the surface of the display device, curing the first organic insulating material, and ashing the cured first organic insulating material.

In the touch display assembly, the second organic insulating layer is formed by cleaning a surface of the bridge portion of the first touch sensing electrode and a surface of a portion of the first organic insulating layer which is not covered by the bridge portion, disposing a second organic insulating material on the surface of the bridge portion of the first touch sensing electrode and the surface of the portion of the first organic insulating layer which is not covered by the bridge portion, curing the second organic insulating material, and ashing the cured second organic insulating material.

In the touch display assembly, an array of protrusions and/or an array of depressions are disposed on a surface of an encapsulation layer of the display device, the array of protrusions includes at least two protrusions, the array of depressions includes at least two depressions, the protrusions and/or the depressions are configured to improve a coupling between the first organic insulating layer and the encapsulating layer, and at least a part of the first organic insulating layer is disposed in gaps between two of the adjacent protrusions or in the depressions.

A method for manufacturing a touch display assembly, comprising:

a step A of forming a display device; a step B of disposing a first organic insulating layer on the display device;

a step C of disposing a second organic insulating layer on the first organic insulating layer;

a step D of disposing a first touch sensing electrode and a second touch sensing electrode on the second organic insulating layer, wherein in a direction perpendicular to a plane which the display device faces, a bridge portion of the first touch sensing electrode passes through the second organic insulating layer and is overlapped by the second touch sensing electrode; and a step E of disposing a protective layer on the first touch sensing electrode, the second touch sensing electrode, and a portion of the second organic insulating layer which is not covered by the first touch sensing electrode and the second touch sensing electrode.

In the method for manufacturing the touch display assembly, material of any one of the first organic insulating layer, the second organic insulating layer, and the protective layer is photoresist material, resin material, or polyimide material.

In the method for manufacturing the touch display assembly, the step B comprises:

a step b1 of cleaning a surface of the display device;

a step b2 of disposing a first organic insulating material on the surface of the display device;

a step b3 of curing the first organic insulating material; and a step b4 of ashing the cured first organic insulating material to form the first organic insulating layer.

In the method for manufacturing the touch display assembly, the step C comprises:

a step c1 of cleaning a surface of the bridge portion of the first touch sensing electrode and a surface of a portion of the first organic insulating layer which is not covered by the bridge portion;

a step c2 of disposing a second organic insulating material on the surface of the bridge portion of the first touch sensing electrode and the surface of the portion of the first organic insulating layer which is not covered by the bridge portion;

a step c3 of curing the second organic insulating material; and a step c4 of ashing the cured second organic insulating material to form the second organic insulating layer.

In the method for manufacturing the touch display assembly, the step E comprises:

a step e1 of disposing an organic material on the first touch sensing electrode, the second touch sensing electrode, and a portion of the second organic insulating layer which is not covered by the first touch sensing electrode and the second touch sensing electrode;

a step e2 of performing yellow light irradiation on the organic material;

a step e3 of baking the organic material after performing the yellow light irradiation; and a step e4 of ashing the baked organic material to form the protective layer.

In the method for manufacturing the touch display assembly, the step A comprises:

a step a1 of disposing a thin film transistor device layer on the substrate;

a step a2 of disposing a light emitting device layer on the thin film transistor device layer; and a step a3 of disposing an encapsulation layer on the light emitting device layer.

In the method for manufacturing the touch display assembly, the step B includes a step of disposing a first organic insulating layer on the encapsulation layer of the display device; and after the step a3, the method for manufacturing the touch display assembly further includes a step H of disposing an array of protrusions and/or an array of depressions on a surface of the encapsulation layer of the display device, wherein the array of protrusions includes at least two protrusions, the array of depressions includes at least two depressions, and the protrusions and/or the depressions are configured to improve a coupling between the first organic insulating layer and the encapsulating layer.

In the method for manufacturing the touch display assembly, material of any one of the first organic insulating layer, the second organic insulating layer, and the protective layer is photoresist material, resin material, or polyimide material.

Compared with the prior art, by stacking the first organic insulating layer, the first touch sensing electrode, the second organic insulating layer, the second touch sensing electrode, and the protective layer together, the touch device of the touch display assembly is formed. Therefore, after the touch display assembly undergoes many times of bending, separation of some of devices or films in the touch display assembly from other devices or films is avoided, for facilitating ensuring touch performance of the touch display assembly.

In order to make the above description of the present disclosure more comprehensible, the preferred embodiments are described in detail below with reference to the accompanying drawings.

DETAILED DESCRIPTION OF PREFERRED EMBODIMENTS

The term "embodiment" as used in this specification means serving as an example, implementation, or illustration. Furthermore, the articles "a" or "an" as used in the specification and the appended claims may generally be construed to mean "one or more" unless it is clearly specified to be the singular form in the context.

Figure 1:
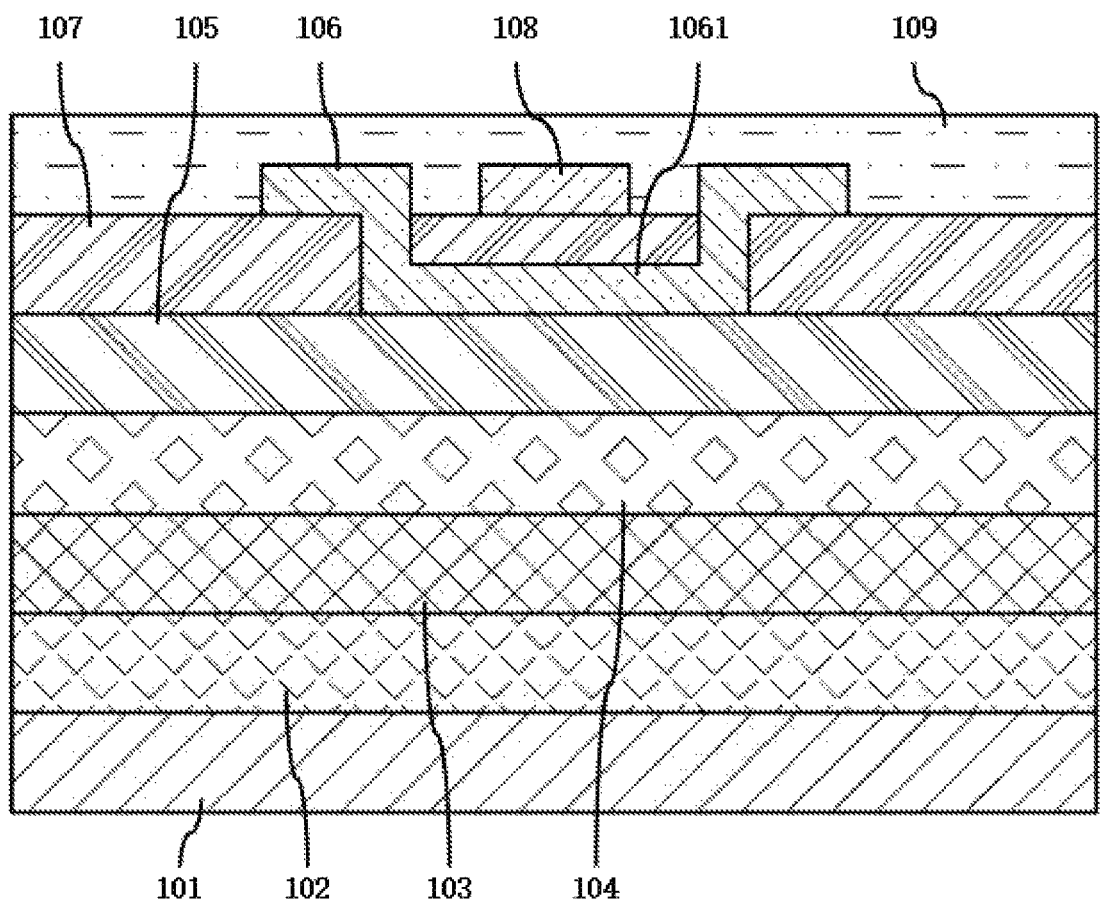
FIG. 1 is a schematic diagram of a touch display assembly of the present disclosure.

Referring to FIG. 1, which is a schematic diagram of a touch display assembly of the present disclosure.

The touch display assembly of the present disclosure includes a display device and a touch device, and the touch device is disposed on the display device. The display device of the present disclosure is suitable for a thin film transistor liquid crystal display (TFT-LCD), an organic light emitting diode (OLED), and the like.

The touch device includes a first organic insulating layer 105, a first touch sensing electrode 106, a second organic insulating layer 107, a second touch sensing electrode 108, and a protective layer 109.

The display device includes a substrate 101, a thin film transistor device layer 102, a light emitting device layer 103, and an encapsulation layer 104. The thin film transistor device layer 102 is disposed on the substrate 101. The light emitting device layer 103 is disposed on the thin film transistor device layer 102. The encapsulation layer 104 is disposed on the light emitting device layer 103.

The first organic insulating layer 105 is disposed on the display device. Specifically, the first organic insulating layer 105 is disposed on the encapsulation layer 104 of the display device.

The second organic insulating layer 107 is disposed on the first organic insulating layer 105. Specifically, the second organic insulating layer 107 is disposed on a bridge portion 1061 of the first touch sensing electrode 106 and a portion of the first organic insulating layer 105 which is not covered by the bridge portion 1061.

The first organic insulating layer 105 is formed by cleaning a surface of the display device (the encapsulation layer 104), disposing a first organic insulating material on the surface of the display device (the encapsulation layer 104), curing the first organic insulating material, and ashing the cured first organic insulating material.

An array of protrusions and/or an array of depressions are disposed on a surface of the encapsulation layer 104 of the display device. The array of protrusions includes at least two protrusions, the array of depressions includes at least two depressions, the protrusions and/or the depressions are configured to improve a coupling between the first organic insulating layer 105 and the encapsulating layer 104, and at least a part of the first organic insulating layer is disposed in gaps between two of the adjacent protrusions or in the depressions.

The first touch sensing electrode 106 and the second touch sensing electrode 108 are both disposed on the second organic insulating layer 107. In a direction perpendicular to a plane which the display device faces, the bridge portion 1061 of the first touch sensing electrode 106 passes through the second organic insulating layer 108 and is overlapped by the second touch sensing electrode 108.

At least a portion of the bridge portion 1061 of the first touch sensing electrode 106 is disposed on the first organic insulating layer 105.

The bridge portion 1061 of the first touch sensing electrode 106 is formed by cleaning a surface of the first organic insulating layer 105, sequentially disposing a first metal material, a second metal material, and a third metal material on the surface of the first organic insulating layer 105, then performing a first photomask process on a combination of the first metal material, the second metal material, and the third metal material, baking the combination of the first metal material, the second metal material, and the third metal material which were subject to the first photomask process, performing a dry etching process on the baked combination of the first metal material, the second metal material, and the third metal material, and removing a residue of the dry etched combination of the first metal material, the second metal material, and the third metal material. The first metal material may be, for example, titanium, the second metallic material may be, for example, aluminum, and the third metallic material may be, for example, titanium.

At a place where the bridge portion 1061 of the first touch sensing electrode 106 is overlapped by the second touch sensing electrode 108, the second organic insulating layer 107 is disposed between the bridge portion 1061 and the second touch sensing electrode 108.

The second organic insulating layer 107 is disposed on the bridge portion 1061 of the first touch sensing electrode 106 and the portion of the first organic insulating layer 105 which is not covered by the bridge portion 1061.

The second organic insulating layer 107 is formed by cleaning a surface of the bridge portion 1061 of the first touch sensing electrode 106 and a surface of the portion of the first organic insulating layer 105 which is not covered by the bridge portion 1061, disposing a second organic insulating material on the surface of the bridge portion 1061 of the first touch sensing electrode 106 and the surface of the portion of the first organic insulating layer 105 which is not covered by the bridge portion 1061, curing the second organic insulating material, and ashing the cured second organic insulating material.

The second touch sensing electrode 108 is formed by cleaning a surface of the second organic insulating layer 107, sequentially disposing a fourth metal material, a fifth metal material and, a sixth metal material on the surface of the second organic insulating layer 107, then performing a second photomask process on a combination of the fourth metal material, the fifth metal material, and the sixth metal material, baking the combination of the fourth metal material, the fifth metal material, and the sixth metal material which were subject to the second photomask process, performing the dry etching process on the baked combination of the fourth metal material, the fifth metal material, and the sixth metal material, and removing a residue of the dry etched combination of the fourth metal material, the fifth metal material, and the sixth metal material. The fourth metallic material may be, for example, titanium, the fifth metallic material may be, for example, aluminum, and the sixth metallic material may be, for example, titanium.

The first touch sensing electrode 106 and the second touch sensing electrode 108 are configured to generate a touch sensing signal when the touch device receives a touch force.

A first gap is formed between the bridge portion 1061 of the first touch sensing electrode 106 and the second touch sensing electrode 108. Capacitance is formed between the bridge portion 1061 of the first touch sensing electrode 106 and the second touch sensing electrode 108. When the touch force is applied, the bridge portion 1061 of the first touch sensing electrode 106 moves relative to the second touch sensing electrode 108, or the second touch sensing electrode 108 moves relative to the bridge portion 1061 of the first touch sensing electrode 106, and the capacitance between the second touch sensing electrode 108 and the first touch sensing electrode 106 changes. The first touch sensing electrode 106 and/or the second touch sensing electrode 108 generate the touch sensing signal.

The protective layer 109 is formed by disposing an organic material on the first touch sensing electrode 106, the second touch sensing electrode 108, and a portion of the second organic insulating layer 107 which is not covered by the first touch sensing electrode 106 and the second touch sensing electrode 108, performing yellow light irradiation on the organic material, baking the organic material after performing the yellow light irradiation; and ashing the baked organic material to form the protective layer.

Material of any one of the first organic insulating layer 105, the second organic insulating layer 107, and the protective layer 109 is a photoresist material, resin material, or polyimide material.

A first via hole and a second via hole are disposed on the second organic insulating layer 107, and the first through hole and the second through hole both penetrate through the second organic insulating layer 107. In a direction perpendicular to a plane which the display device faces, at least a portion of the bridge portion 1061 of the first touch sensing electrode 106 is disposed in the first via hole and the second via hole.

The protective layer 109 is disposed on the first touch sensing electrode 106 and the second touch sensing electrode 108, and disposed on the portion of the second organic insulating layer 107 which is not covered by the first touch sensing electrode 106 and the second touch sensing electrode 108.

Figure 2:
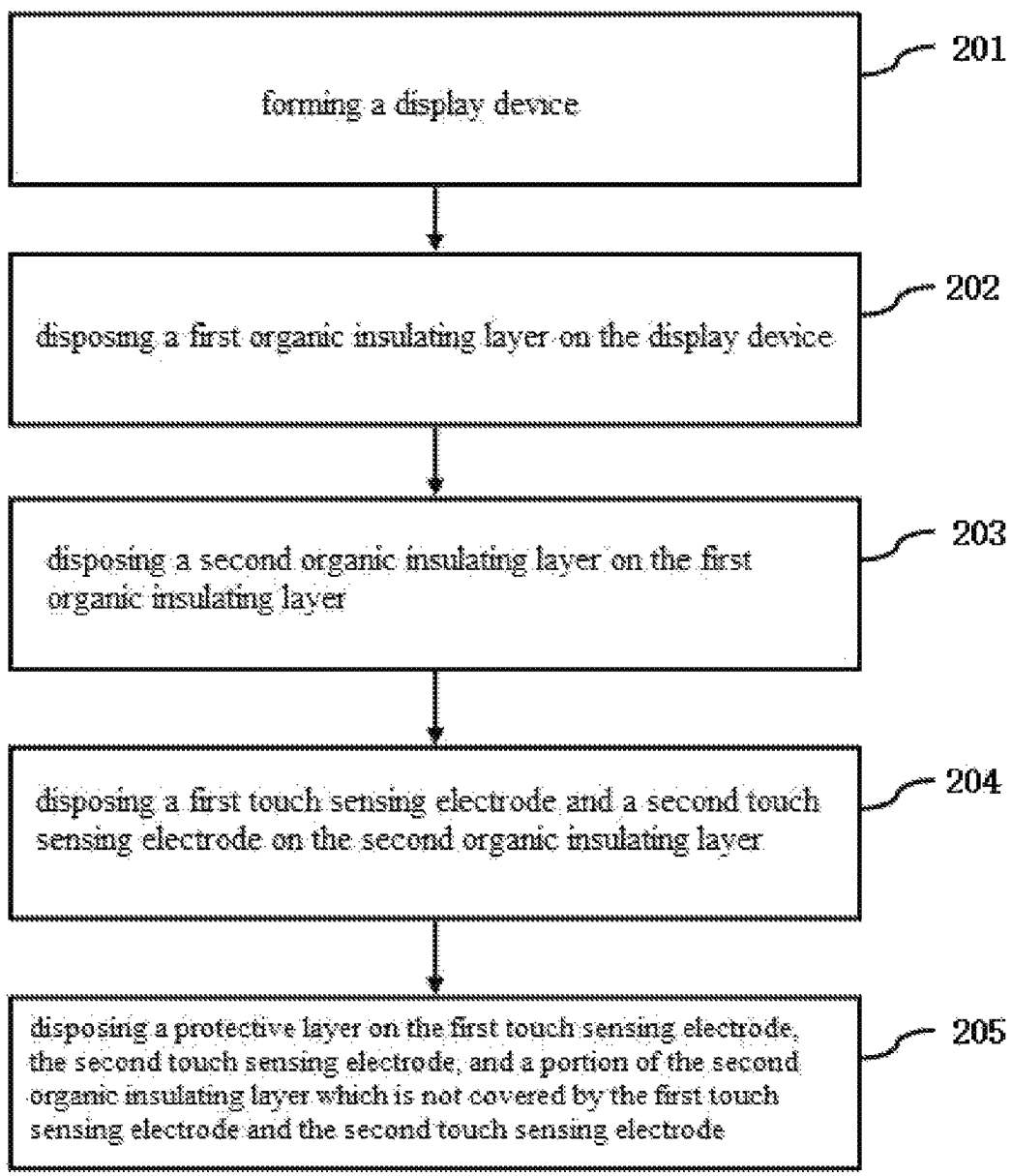
FIG. 2 is a flow chart of a method for manufacturing a touch display assembly of the present disclosure.
Figure 3:
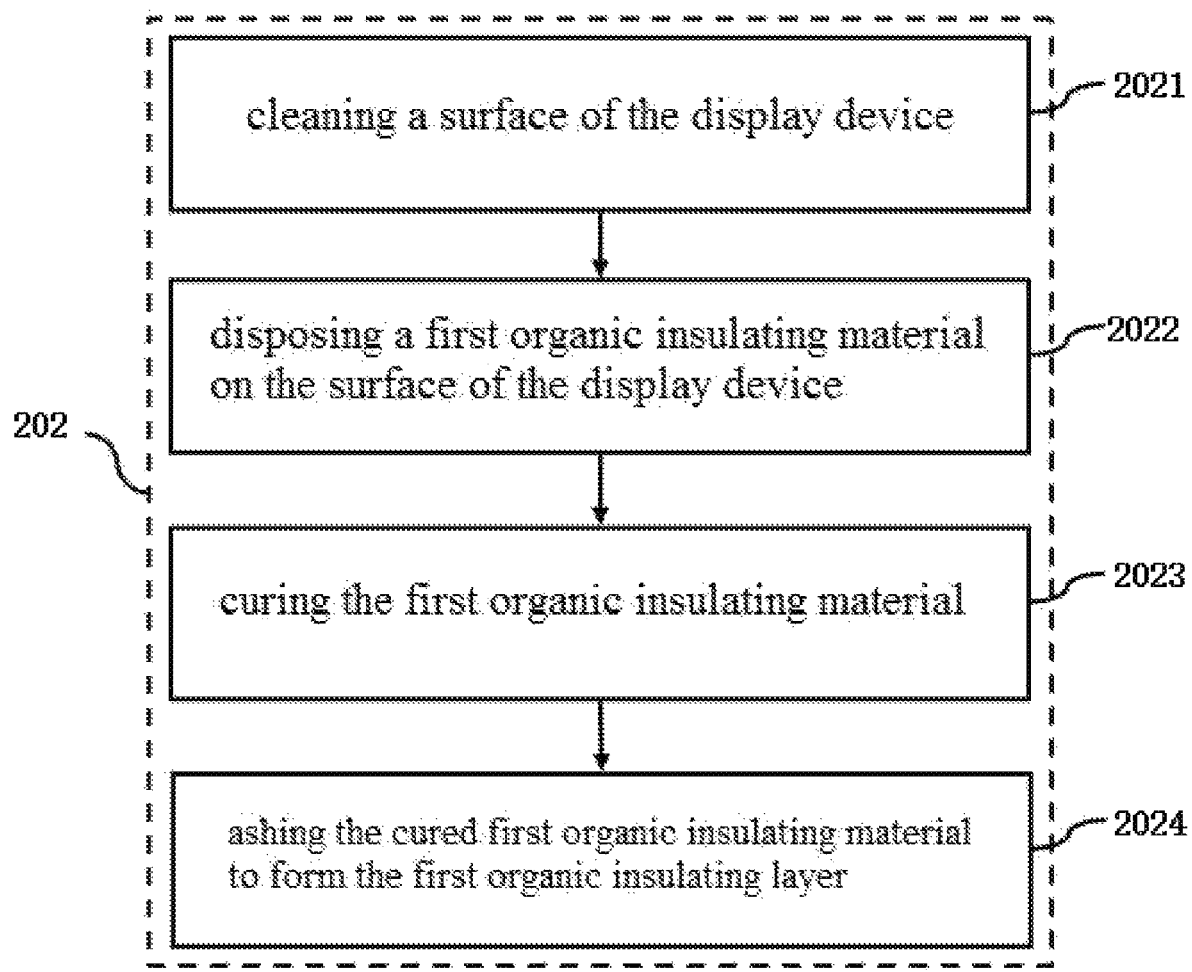
FIG. 3 is a flow chart of steps of disposing a first organic insulating layer on a display device in the method for manufacturing the touch display assembly as shown in FIG. 2.
Figure 4:
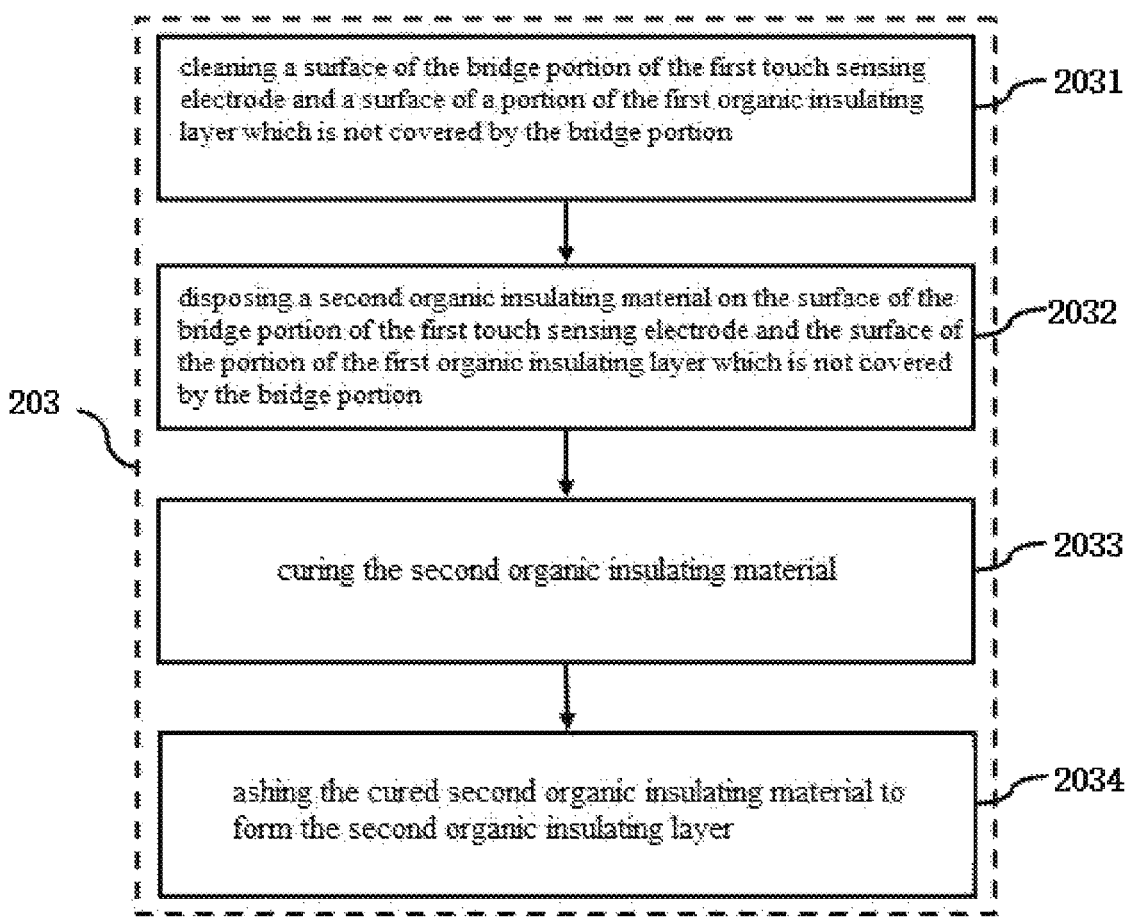
FIG. 4 is a flow chart of steps of disposing a second organic insulating layer on the first organic insulating layer in the method for manufacturing the touch display assembly as shown in FIG. 2.
Figure 5:
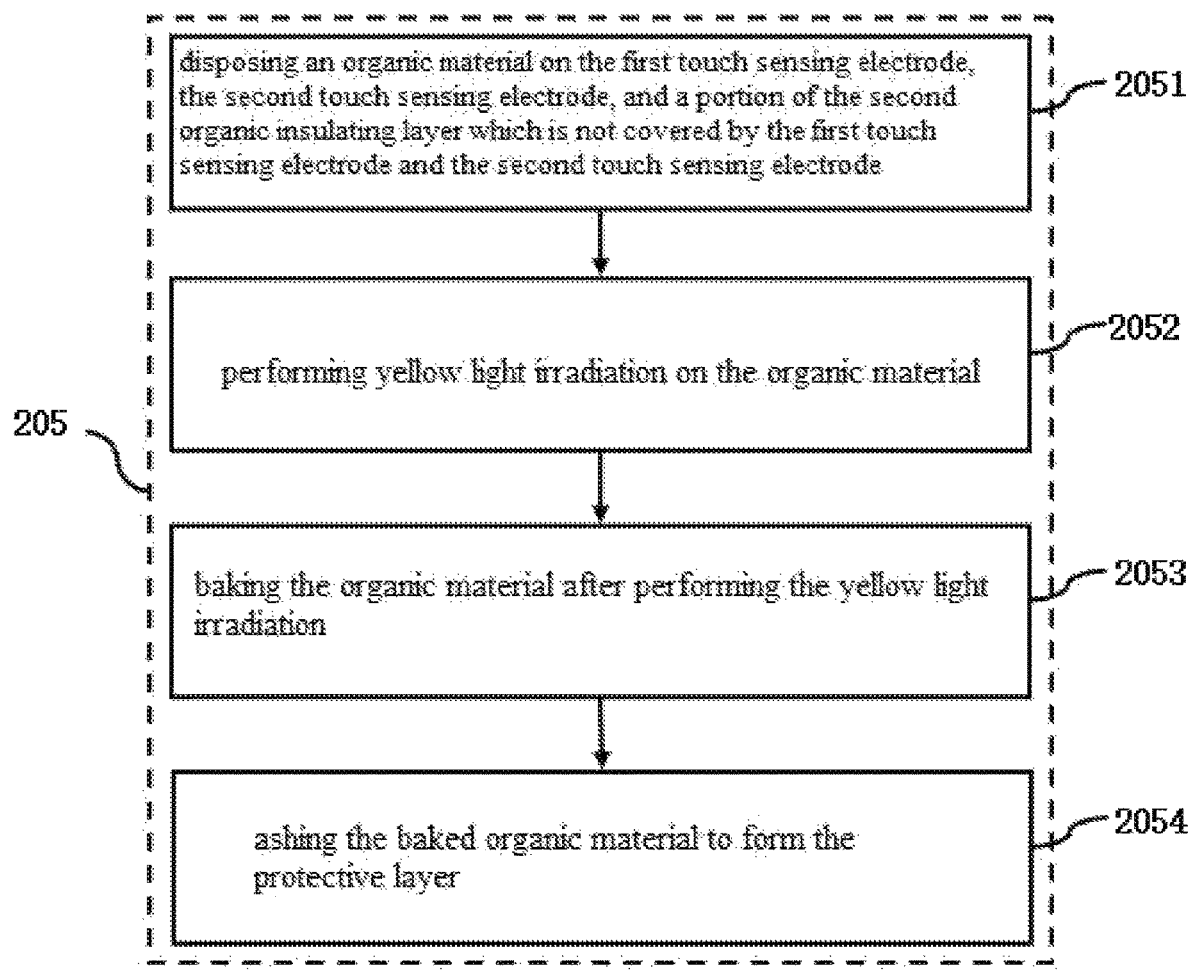
FIG. 5 is a flow chart of steps of disposing a protective layer on a first touch sensing electrode, a second touch sensing electrode, and the second organic insulating layer in the method for manufacturing the touch display assembly as shown in FIG. 2.

Referring to FIG. 2 to FIG. 5. FIG. 2 is a flow chart of a method for manufacturing a touch display assembly of the present disclosure. FIG. 3 is a flow chart of steps of disposing a first organic insulating layer 105 on a display device in the method for manufacturing the touch display assembly as shown in FIG. 2. FIG. 4 is a flow chart of steps of disposing a second organic insulating layer 107 on the first organic insulating layer 105 in the method for manufacturing the touch display assembly as shown in FIG. 2. FIG. 5 is a flow chart of steps of disposing a protective layer 109 on a first touch sensing electrode 106, a second touch sensing electrode 108, and the second organic insulating layer 107 in the method for manufacturing the touch display assembly as shown in FIG. 2.

A method for manufacturing a touch display assembly in the present disclosure includes the following steps.

A step A (201) of forming a display device.

A step B (202) of disposing a first organic insulating layer 105 on the display device.

Specifically, the step B (202) includes:

A step b1 (2021) of cleaning a surface of the display device (an encapsulation layer 104).

A step b2 (2022) of disposing a first organic insulating material on the surface of the display device (the encapsulation layer 104).

A step b3 (2023) of curing the first organic insulating material.

A step b4 (2024) of ashing the cured first organic insulating material to form the first organic insulating layer 105.

A step C (203) of disposing a second organic insulating layer 107 on the first organic insulating layer 105.

Specifically, the step C (203) includes:

A step c1 (2031) of cleaning a surface of the bridge portion 1061 of a first touch sensing electrode 106 and a surface of a portion of the first organic insulating layer 105 which is not covered by the bridge portion.

A step c2 (2032) of disposing a second organic insulating material on the surface of the bridge portion 1061 of the first touch sensing electrode 106 and the surface of the portion of the first organic insulating layer 105 which is not covered by the bridge portion 1061.

A step c3 (2033) of curing the second organic insulating material.

A step c4 (2034) of ashing the cured second organic insulating material to form the second organic insulating layer 107.

After the step B (202) and before the step C (203), the method further includes the following steps:

Step F: forming the bridge portion 1061 of the first touch sensing electrode 106.

Specifically, the step F includes:

A step f1 of cleaning the surface of the first organic insulating layer 105.

A step f2 of sequentially disposing a first metal material, a second metal material, and a third metal material on the surface of the first organic insulating layer 105. The first metallic material may be, for example, titanium, the second metallic material may be, for example, aluminum, and the third metallic material may be, for example, titanium.

A step f3 of performing a first photomask process on a combination of the first metal material, the second metal material, and the third metal material.

A step f4 of baking the combination of the first metal material, the second metal material, and the third metal material which were subject to the first photomask process.

A step f5 of performing a dry etching process on the baked combination of the first metal material, the second metal material, and the third metal material.

A step f6 of removing a residue of the dry etched combination of the first metal material, the second metal material, and the third metal material, to form the bridge portion 1061 of the first touch sensing electrode 106.

A step D (204) of disposing the first touch sensing electrode 106 and a second touch sensing electrode 108 on the second organic insulating layer 107, wherein in a direction perpendicular to a plane which the display device faces, the bridge portion 1061 of the first touch sensing electrode 106 passes through the second organic insulating layer 107 and is overlapped by the second touch sensing electrode 108.

Specifically, the step D (204) includes:

A step d1 of cleaning a surface of the second organic insulating layer 107.

A step d2 of sequentially disposing a fourth metal material, a fifth metal material, and a sixth metal material on the surface of the second organic insulating layer 107. The fourth metallic material may be, for example, titanium, the fifth metallic material may be, for example, aluminum, and the sixth metallic material may be, for example, titanium.

A step d3 of performing a second photomask process on a combination of the fourth metal material, the fifth metal material, and the sixth metal material.

A step d4 of baking the combination of the fourth metal material, the fifth metal material, and the sixth metal material which were subject to the second photomask process.

A step d5 of performing the dry etching process on the baked combination of the fourth metal material, the fifth metal material, and the sixth metal material.

A step d6 of removing a residue of the dry etched combination of the fourth metal material, the fifth metal material, and the sixth metal material to form the first touch sensing electrode 106 and the second touch sensing electrode 108.

A step E (205) of disposing a protective layer 109 on the first touch sensing electrode 106, the second touch sensing electrode 108, and a portion of the second organic insulating layer 107 which is not covered by the first touch sensing electrode 106 and the second touch sensing electrode 108.

Specifically, the step E (205) includes:

A step e1 (2051) of disposing an organic material on the first touch sensing electrode 106, the second touch sensing electrode 108, and the portion of the second organic insulating layer 107 which is not covered by the first touch sensing electrode 106 and the second touch sensing electrode 108.

A step e2 (2052) of performing yellow light irradiation on the organic material;

A step e3 (2053) of baking the organic material after performing the yellow light irradiation.

A step e4 (2054) of ashing the baked organic material to form the protective layer 109.

Material of any one of the first organic insulating layer 105, the second organic insulating layer 107, and the protective layer 109 is a photoresist material, resin material, or polyimide material.

After the step C (203), and before the step D (204), the method for manufacturing the touch display assembly further includes the following steps:

A step G of forming a first via hole and a second via hole on the second organic insulating layer 107, wherein the first via hole and the second via hole both penetrate through the second organic insulating layer 107.

The step A (201) includes:

A step a1 of disposing a thin film transistor device layer 102 on the substrate 101.

A step a2 of disposing a light emitting device layer 103 on the thin film transistor device layer 102.

A step a3 of disposing the encapsulation layer 104 on the light emitting device layer 103.

The step B (202) is disposing the first organic insulating layer 105 on the encapsulation layer 104 of the display device.

After the step a3, the method for manufacturing the touch display assembly further includes the following steps:

A step H of disposing an array of protrusions and/or an array of depressions on a surface of the encapsulation layer of the display device, wherein the array of protrusions includes at least two protrusions, the array of depressions includes at least two depressions, and the protrusions and/or the depressions are configured to improve a coupling between the first organic insulating layer 105 and the encapsulating layer 104.

In the present disclosure, by stacking the first organic insulating layer 105, the first touch sensing electrode 106, the second organic insulating layer 107, the second touch sensing electrode 108, and the protective layer 109 together, the touch device of the touch display assembly is formed. The first organic insulating layer 105 and the second organic insulating layer 107 have high ductility, so that after the touch display assembly undergoes many times of bending, separation of some of devices or films in the touch display assembly from other devices or films is avoided, which is beneficial to ensuring touch performance of the touch display assembly. In addition, the first organic insulating layer 105 and the second organic insulating layer 107 are able to effectively isolate the capacitance coupling between the devices or films in the touch display assembly of the present disclosure.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:
1. A touch display assembly, comprising:
a display device;
a touch device disposed on the display device, and including:
  a first organic insulating layer disposed on the display device;
  a second organic insulating layer disposed on the first organic insulating layer;
  a first touch sensing electrode;
  a second touch sensing electrode; and
  a protective layer;
  wherein the first touch sensing electrode and the second touch sensing electrode are both disposed on the second organic insulating layer; and in a direction perpendicular to a plane which the display device faces, a bridge portion of the first touch sensing electrode passes through the second organic insulating layer and is overlapped by the second touch sensing electrode;
  wherein an array of protrusions and/or an array of depressions are disposed on a surface of an encapsulation layer of the display device, the array of protrusions includes at least two protrusions, the array of depressions includes at least two depressions, the protrusions and/or the depressions are configured to improve a coupling between the first organic insulating layer and the encapsulating layer, and at least a part of the first organic insulating layer is disposed in gaps between two of the adjacent protrusions or in the depressions.

2. The touch display assembly as claimed in claim 1, wherein material of any one of the first organic insulating layer, the second organic insulating layer, and the protective layer is a photoresist material, resin material, or polyimide material.

3. The touch display assembly as claimed in claim 1, wherein at least a portion of the bridge portion is disposed on the first organic insulating layer.

4. The touch display assembly as claimed in claim 3, wherein at a place where the bridge portion of the first touch sensing electrode is overlapped by the second touch sensing electrode, the second organic insulating layer is disposed between the bridge portion and the second touch sensing electrode.

5. The touch display assembly as claimed in claim 1, wherein the protective layer is disposed on the first touch sensing electrode and the second touch sensing electrode, and disposed on a portion of the second organic insulating layer which is not covered by the first touch sensing electrode and the second touch sensing electrode.

6. A method for manufacturing a touch display assembly, comprising:
a step A of forming a display device; wherein the step A includes:
  a step a1 of disposing a thin film transistor device layer on the substrate;
  a step a2 of disposing a light emitting device layer on the thin film transistor device layer; and
  a step a3 of disposing an encapsulation layer on the light emitting device layer;
a step H of disposing an array of protrusions or an array of depressions on a surface of the encapsulation layer of the display device, after the step a3, wherein the array of protrusions includes at least two protrusions, the array of depressions includes at least two depressions, and the protrusions or the depressions are configured to improve a coupling of the first organic insulating layer and the encapsulating layer;

a step B of disposing a first organic insulating layer on the display device; wherein the step B includes a step of disposing the first organic insulating layer on the encapsulation layer of the display device;

a step C of disposing a second organic insulating layer on the first organic insulating layer;

a step D of disposing a first touch sensing electrode and a second touch sensing electrode on the second organic insulating layer, wherein in a direction perpendicular to a plane which the display device faces, a bridge portion of the first touch sensing electrode passes through the second organic insulating layer and is overlapped by the second touch sensing electrode; and a step E of disposing a protective layer on the first touch sensing electrode, the second touch sensing electrode, and a portion of the second organic insulating layer which is not covered by the first touch sensing electrode and the second touch sensing electrode.

7. The method for manufacturing the touch display assembly as claimed in claim 6, wherein material of any one of the first organic insulating layer, the second organic insulating layer, and the protective layer is a photoresist material, resin material, or polyimide material.

8. The method for manufacturing the touch display assembly as claimed in claim 6, wherein the step B comprises:

a step b1 of cleaning a surface of the display device;

a step b2 of disposing a first organic insulating material on the surface of the display device;

a step b3 of curing the first organic insulating material; and a step b4 of ashing the cured first organic insulating material to form the first organic insulating layer.

9. The method of manufacturing the touch display assembly according to claim 6, wherein the step C comprises:

a step c1 of cleaning a surface of the bridge portion of the first touch sensing electrode and a surface of a portion of the first organic insulating layer which is not covered by the bridge portion;

a step c2 of disposing a second organic insulating material on the surface of the bridge portion of the first touch sensing electrode and the surface of the portion of the first organic insulating layer which is not covered by the bridge portion;

a step c3 of curing the second organic insulating material; and a step c4 of ashing the cured second organic insulating material to form the second organic insulating layer.

10. The method for manufacturing a touch display assembly as claimed in claim 6, wherein the step E comprises:

a step e1 of disposing an organic material on the first touch sensing electrode, the second touch sensing electrode, and the portion of the second organic insulating layer which is not covered by the first touch sensing electrode and the second touch sensing electrode;

a step e2 of performing yellow light irradiation on the organic material;

a step e3 of baking the organic material after performing the yellow light irradiation; and a step e4 of ashing the baked organic material to form the protective layer.

* * * * *